(12) United States Patent
Matsuoka

(10) Patent No.: US 8,038,769 B2
(45) Date of Patent: Oct. 18, 2011

(54) LIQUID PROCESSING APPARATUS, LIQUID PROCESSING METHOD AND STORAGE MEDIUM

(75) Inventor: Nobuaki Matsuoka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/030,316

(22) Filed: Feb. 18, 2011

(65) Prior Publication Data

US 2011/0143645 A1    Jun. 16, 2011

Related U.S. Application Data

(62) Division of application No. 11/882,558, filed on Aug. 2, 2007, now Pat. No. 7,914,613.

(30) Foreign Application Priority Data

Sep. 8, 2006 (JP) ................................. 2006-244653

(51) Int. Cl.
*B01D 50/00* (2006.01)

(52) U.S. Cl. ............... 95/14; 55/385.2; 95/273; 96/417; 96/420; 454/187; 700/273

(58) Field of Classification Search .............. 95/14, 273; 55/385.2; 454/187; 96/417, 420; 700/273

See application file for complete search history.

(56) References Cited

U.S. PATENT DOCUMENTS

| 6,306,455 B1 | 10/2001 | Takamori et al. |
| 6,368,776 B1 | 4/2002 | Harada et al. |
| 6,960,236 B1 | 11/2005 | Tamura et al. |
| 7,914,613 B2 * | 3/2011 | Matsuoka ........ 96/417 |

FOREIGN PATENT DOCUMENTS

| JP | 2000-150335 | 5/2000 |
| JP | 2000-182949 | 6/2000 |

* cited by examiner

*Primary Examiner* — Duane Smith
(74) *Attorney, Agent, or Firm* — Smith, Gambrell & Russell, LLP

(57) ABSTRACT

A liquid processing apparatus, includes an apparatus main body, a power room having an atmosphere separated from the clean room by a partition member, an air suction path configured to suction an air in the clean room and take the air into the power room, a temperature control part provided in the power room and configured to control at least a temperature of the air taken in via the air suction path, an air supplying path configured to supply the air from the temperature control part to the liquid processing unit, a ventilation part configured to take the air from the air suction path and supply the air via the air supplying path, and a cleaning filer configured to clean the air taken in from the air suction path.

10 Claims, 12 Drawing Sheets

LIQUID PROCESSING APPARATUS, LIQUID PROCESSING METHOD AND STORAGE MEDIUM

CROSS REFERENCE TO RELATED APPLICATION

This application is a divisional of Ser. No. 11/882,558, filed Aug. 2, 2007, which is being incorporated in its entirety herein by reference.

BACKGROUND OF THE INVENTION

1. Field of the Invention

The present invention generally relates to liquid processing apparatuses, liquid processing methods and storage media. More specifically, the present invention relates to a liquid processing apparatus including a liquid processing unit configured to supply a chemical solution to a substrate so that a liquid process is performed, a liquid processing method, and a storage medium where a computer program for implementing its coating method is stored.

2. Description of the Related Art

Conventionally, in a photo resist process as one of semiconductor manufacturing processes, for example, resist liquid is coated on a surface of a substrate, a semiconductor wafer that will be referred "wafer" hereinafter so that a resist film is formed; the resist film is exposed with a designated pattern; and then the substrate is developed so that desired pattern is formed on the substrate.

Such a process is generally performed by using a system where an exposing apparatus is connected to a coating and developing apparatus configured to perform a coating process and a developing process.

Such a system is provided in a clean room. A down flow of air is maintained in this clean room in order to prevent particles from flying. The air is controlled so as to have the designated temperature and moisture content in order to prevent influencing on a process of the system.

In addition, in the above-mentioned coating and developing apparatus, various kinds of liquid processing apparatuses including a resist liquid coating unit, developing unit, or the like are provided. The resist liquid coating unit is configured to coat the above-mentioned resist liquid. The developing unit is configured to coat developing liquid so as to perform the above-mentioned developing process.

When the liquid process is applied to the wafer in each liquid process unit, it is necessary to maintain a process atmosphere of the wafer to be a designated atmosphere. Because of this, it is necessary to supply air whose temperature and moisture content are controlled to these liquid processing units.

Accordingly, a temperature and moisture control unit configured to take air of the designated atmosphere and perform temperature and moisture control of the taken air, a filter configured to clean the air whose temperature and moisture are controlled, and others are provided in the coating and developing apparatus. In addition, an air supplying part configured to supply the air, whose temperature and moisture content are controlled by the temperature and moisture control unit, to each liquid process unit is provided in the coating and developing apparatus.

If the difference of the temperature and moisture between the air before the temperature and moisture are controlled and the air after the temperature and moisture are controlled is large, the workload of the temperature and moisture control unit becomes large. In order to prevent generation of such a workload, it is normal practice that the air in the clean room where the temperature and moisture are controlled is taken by the air supplying part so that the temperature and moisture control is performed and the air is supplied to each liquid processing unit.

However, an apparatus for directly applying a process to the wafer such as the coating and developing apparatus or the exposing apparatus should be provided in a limited space of the clean room with a priority. Therefore, this air supplying part is frequently provided under the floor. It is necessary to provide an air supplying pipe and an air suction pipe under the floor. Here, the air supplying pipe is configured to supply the air in the clean room to the air supplying part. The air suction pipe is configured to supply the temperature and moisture controlled air from the air supplying part to the coating and developing apparatus.

As discussed above, the area of the clean room is limited. Under the floor of the clean room, not only the air supplying pipe and the air suction pipe but also a complex and large pipe system is provided. Gas or liquid for supplying power to the coating and developing apparatus flows in the pipe system. Accordingly, it may be necessary to provide the air supplying pipe and the air suction pipe through a small space formed between pipes of this pipe system.

In the meantime, recently, as the wafer size has become large, each processing unit in the coating and developing apparatus has become large. Furthermore, as the resist pattern to be formed becomes minute, it is necessary to perform the temperature and moisture control of the periphery of the wafer with high precision. Accordingly, it is considered to supply the temperature and moisture controlled air in not only the processing unit but also the conveyance area of the wafer between the processing units.

In this case, it is necessary for the air supplying part to supply a large amount of the air to the coating and developing apparatus. For example, while the temperature and moisture controlled air of 35 $m^3$/minute should be supplied according to the conventional art, it is now required to supply the air at 70 $m^3$/minute.

In addition, as the amount of the temperature and moisture controlled air to be supplied is increased, the amount of suction of the air in the clean room should be increased. Because of this, it is required to make the diameter of the air supplying pipe large.

Furthermore, it is considered to provide a heat insulation material in the periphery of the air supplying pipe in order to prevent the influence of outside air and control the temperature and moisture with high precision.

However, as discussed above, the complex pipe system is provided under the floor of the clean room. Accordingly, if the diameter is large and there is heat insulation material on the periphery of the air supplying pipe, the sizes of the air supplying pipe and the air suction pipe are large so as not to be provided between the space between the pipes of the pipe system. Hence, it may be difficult to provide the large size air supplying pipe and air suction pipe.

The length of the air supplying pipe and air suction pipe may be made large and plural portions of the air supplying pipe and air suction pipe may be curved so that the air supplying pipe and air suction pipe are provided with a space with the pipe system under the floor. However, if the air supplying pipe is too long and curved too much, it may be difficult to control the temperature and moisture and the amount of the air flowing into the pipe with high precision. As a result of this, a processing atmosphere of the wafer in the liquid processing unit may be influenced.

In addition, it is necessary to provide the air supplying pipe and the air suction pipe so that the air supplying pipe and the air suction pipe can be separated from not only the pipe system but also a beam or the like of a structure where the clean room is provided.

Thus, there may be an obstacle to providing the coating and developing apparatus with the air supplying pipe and the air suction pipe.

While a mechanism for supplying clean air to a resist coating apparatus and receiving the supplied air is discussed at paragraph 0045 of Japanese Patent No. 3375294, this mechanism does not solve the above-discussed problems. Furthermore, while a mechanism for individually controlling the atmosphere of each processing unit of a processing apparatus is discussed at paragraph 0021 and 0022 of Japanese Patent No. 3388706, this mechanism does not solve the above-discussed problems.

SUMMARY OF THE INVENTION

Accordingly, embodiments of the present invention may provide a novel and useful liquid processing apparatus, liquid processing method and storage medium solving one or more of the problems discussed above.

More specifically, the embodiments of the present invention may provide a liquid processing apparatus whereby an arrangement space of a pipe can be made small in a state where air in a clean room in which temperature and moisture are relatively stable is taken in and at least the temperature is controlled, and the air is supplied to a liquid processing unit configured to perform a liquid process on a substrate.

The embodiments of the present invention may also provide a liquid processing method and a storage medium where a computer program for implementing the method is stored.

One aspect of the present invention may be to provide a liquid processing apparatus, including:
an apparatus main body having:
  a liquid processing unit provided in a clean room and configured to supply a chemical solution to a substrate and perform a liquid process;
  a heating unit configured to perform a heating process on the substrate before or after the liquid process is performed by the liquid processing unit; and
  a transferring part configured to transfer the substrate between the heating unit and the liquid processing unit;
  a power room having an atmosphere separated from the clean room by a partition member;
  an air suction path configured to suction an air in the clean room and take the air into the power room;
  a temperature control part provided in the power room and configured to control at least a temperature of the air taken in via the air suction path;
  an air supplying path configured to supply the air from the temperature control part to the liquid processing unit;
  a ventilation part configured to take the air from the air suction path and supply the air via the air supplying path; and
  a cleaning filer configured to clean the air taken in from the air suction path;
  wherein the air suction path and the air supplying path are formed by an internal space of an internal pipe of a double pipe or a space between the internal pipe and an external pipe of the double pipe.

Another aspect of the present invention may be to provide a liquid processing method using a liquid processing apparatus, the liquid processing apparatus including an apparatus main body, the apparatus main body having:
  a liquid processing unit provided in a clean room and configured to supply a chemical solution to a substrate and perform a liquid process;
  a heating unit configured to perform a heating process on the substrate before or after the liquid process is performed by the liquid processing unit; and
  a transferring part configured to transfer the substrate between the heating unit and the liquid processing unit;
the liquid processing method including:
  a step of suctioning air in the clean room and taking the air into a power room having an atmosphere separated from the clean room by a partition member;
  a step of controlling a temperature of the air taken in via the air suction path in the power room;
  a step of supplying the air whose temperature is controlled to the liquid processing unit;
  a step of suctioning the air from the air suction path and supplying the air via the air supplying path; and
  a step of cleaning the air taken in from the air suction path;
  wherein the air suction path and the air supplying path are formed by either an internal space of an internal pipe of a double pipe or a space between the internal pipe and an external pipe of the double pipe.

Other aspect of the present invention may be to provide a recording medium where a computer program is stored, the computer program used for a liquid processing apparatus, the liquid being processing apparatus including an apparatus main body, the apparatus main body having:
  a liquid processing unit provided in a clean room and configured to supply a chemical solution to a substrate and perform a liquid process;
  a heating unit configured to perform a heating process on the substrate before or after the liquid process is performed by the liquid processing unit; and
  a transferring part configured to transfer the substrate between the heating unit and the liquid processing unit;
the computer program implementing a liquid processing method, the liquid processing method including:
  a step of suctioning air in the clean room and taking the air in a power room having an atmosphere separated from the clean room by a partition member;
  a step of controlling a temperature of the air taken in via the air suction path in the power room;
  a step of supplying the air whose temperature is controlled to the liquid processing unit;
  a step of suctioning the air from the air suction path and supplying the air via the air supplying path; and
  a step of cleaning the air taken in from the air suction path;
  wherein the air suction path and the air supplying path are formed by either an internal space of an internal pipe of a double pipe or a space between the internal pipe and an external pipe of the double pipe.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 1 through FIG. 12 of embodiments of the present invention.

Figure 1:
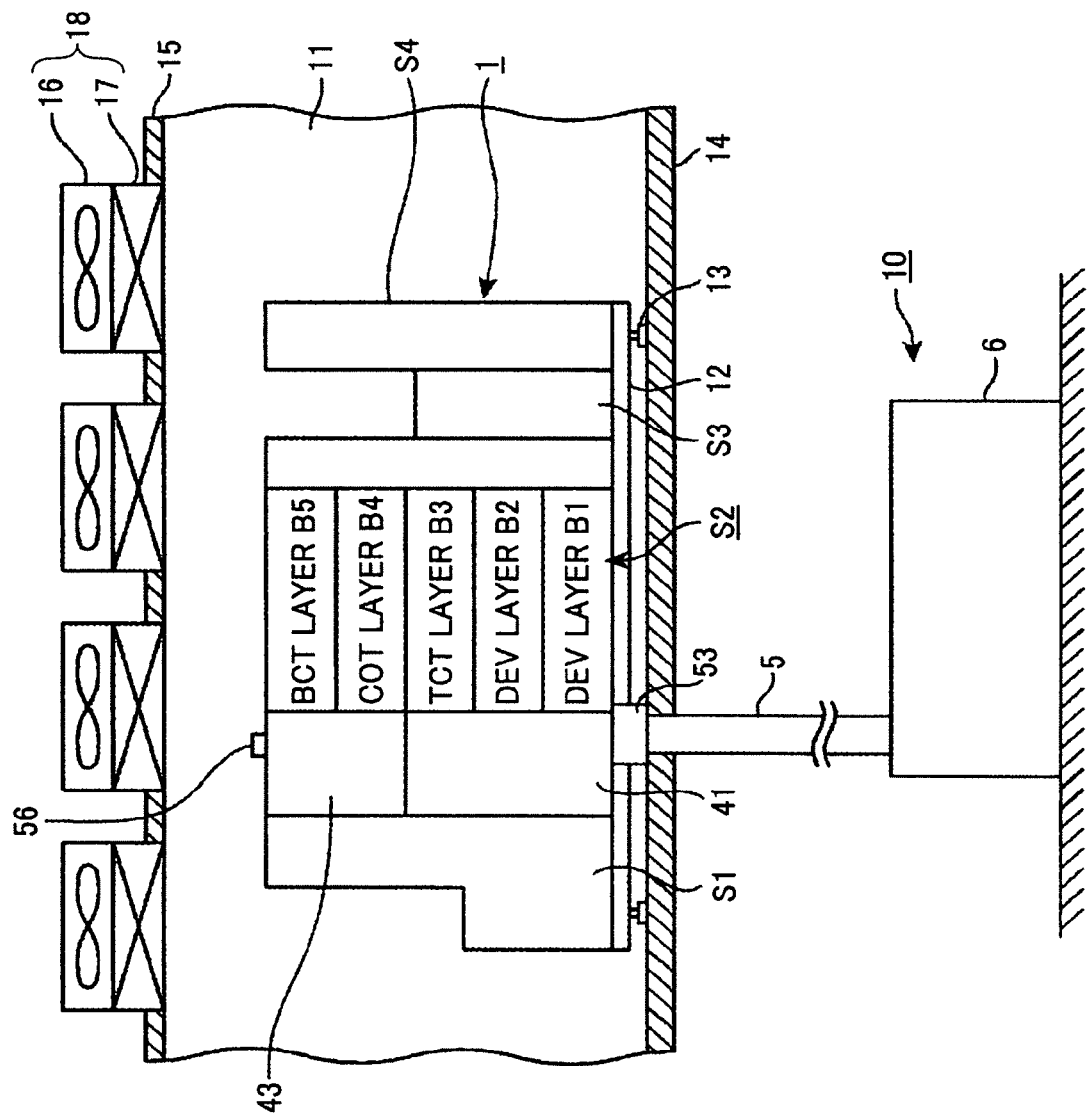
FIG. 1 is a schematic view showing a structure of a coating and developing apparatus as an example of a coating apparatus of an embodiment of the present invention.

First, a coating and developing apparatus as an example of a coating apparatus of an embodiment of the present invention is discussed. FIG. 1 is a schematic view showing a structure of the coating and developing apparatus as the example of the coating apparatus of the embodiment of the present invention.

As shown in FIG. 1, an exposing apparatus S4 is connected to a coating and developing apparatus main body 1. The coating and developing apparatus main body 1 is, for example, provided in a clean room 11 in a semiconductor manufacturing factory. The inside of the clean room 11 is maintained at a designated cleanliness degree. The coating and developing apparatus main body 1 is grounded to a floor 14 forming the clean room 11 via leg parts 13 provided on a bottom plate 12 of the coating and developing apparatus main body 1.

The floor 14 has, for example, a grating structure (not shown in FIG. 1). In addition, while a large number of the leg parts 13 are provided on the bottom plate 12, only two leg parts 13 are indicated in FIG. 1 for the convenience of explanation.

A large number of fan filer units (FFUs) 18 formed by fans 16 and filters 17 are provided at the ceiling of the clean room 11. The filter 17 is configured to remove particles. Air whose temperature and moisture are controlled by a temperature and moisture control mechanism (not shown in FIG. 1) is cleaned by removal of the particles by the FFUs 18 and supplied toward the floor 14. As a result of this, the down flow of the air is formed in the entirety of the clean room 11. The filter 17 corresponds to a jet opening of air from the ceiling mentioned in claims below.

A power room 10 is provided under the floor of the clean room 11. The environment of the power room 10 is separated from the environment of the clean room 11.

A pipe part 5 is provided under the floor of the clean room 11. An air supplying part 6 is provided in the power room 10. Air flows between the coating and developing apparatus main body 1 and the air supplying part 6 via the pipe part 5.

Figure 2:
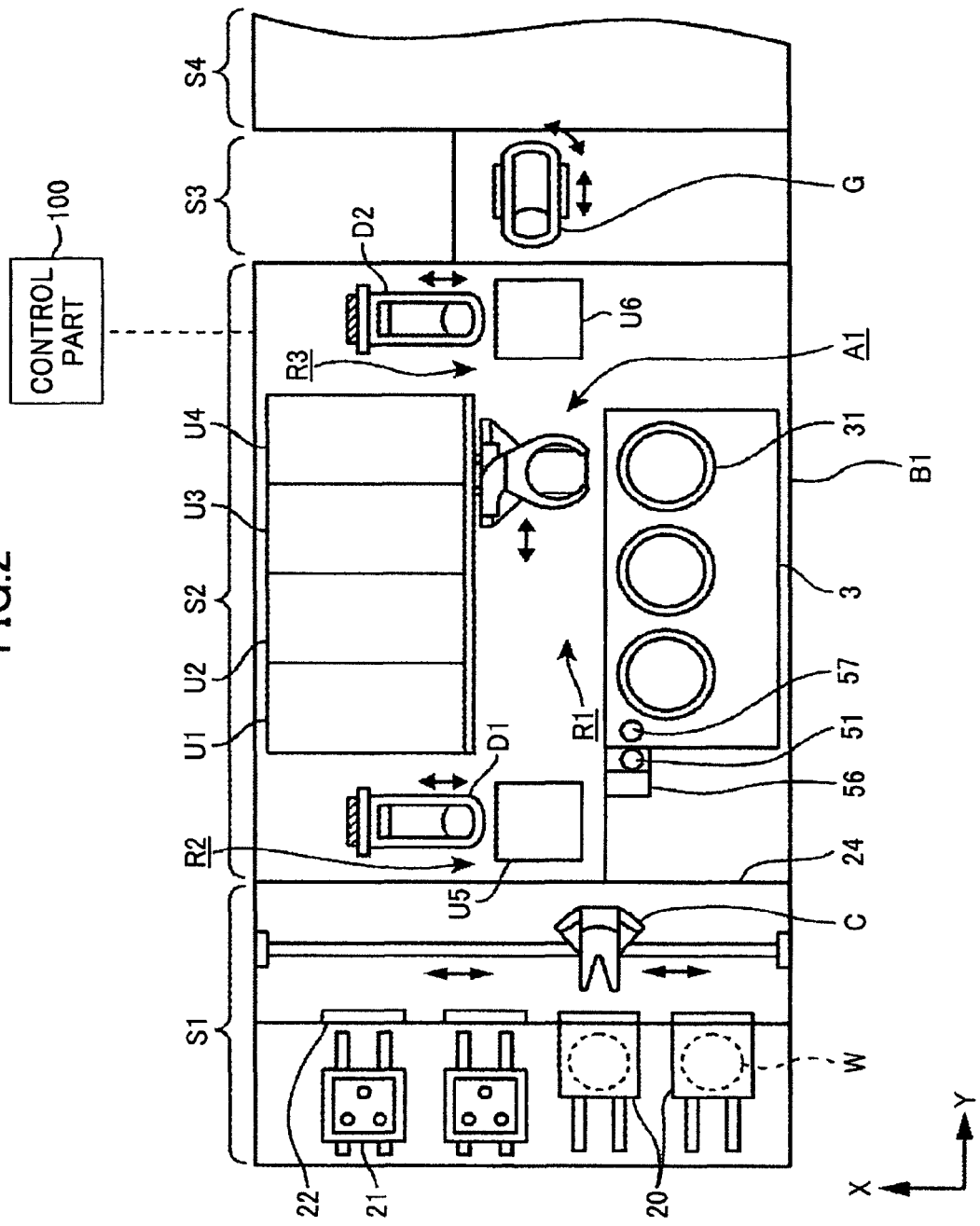
FIG. 2 is a plan view of the coating and developing apparatus of the embodiment of the present invention.
Figure 3:
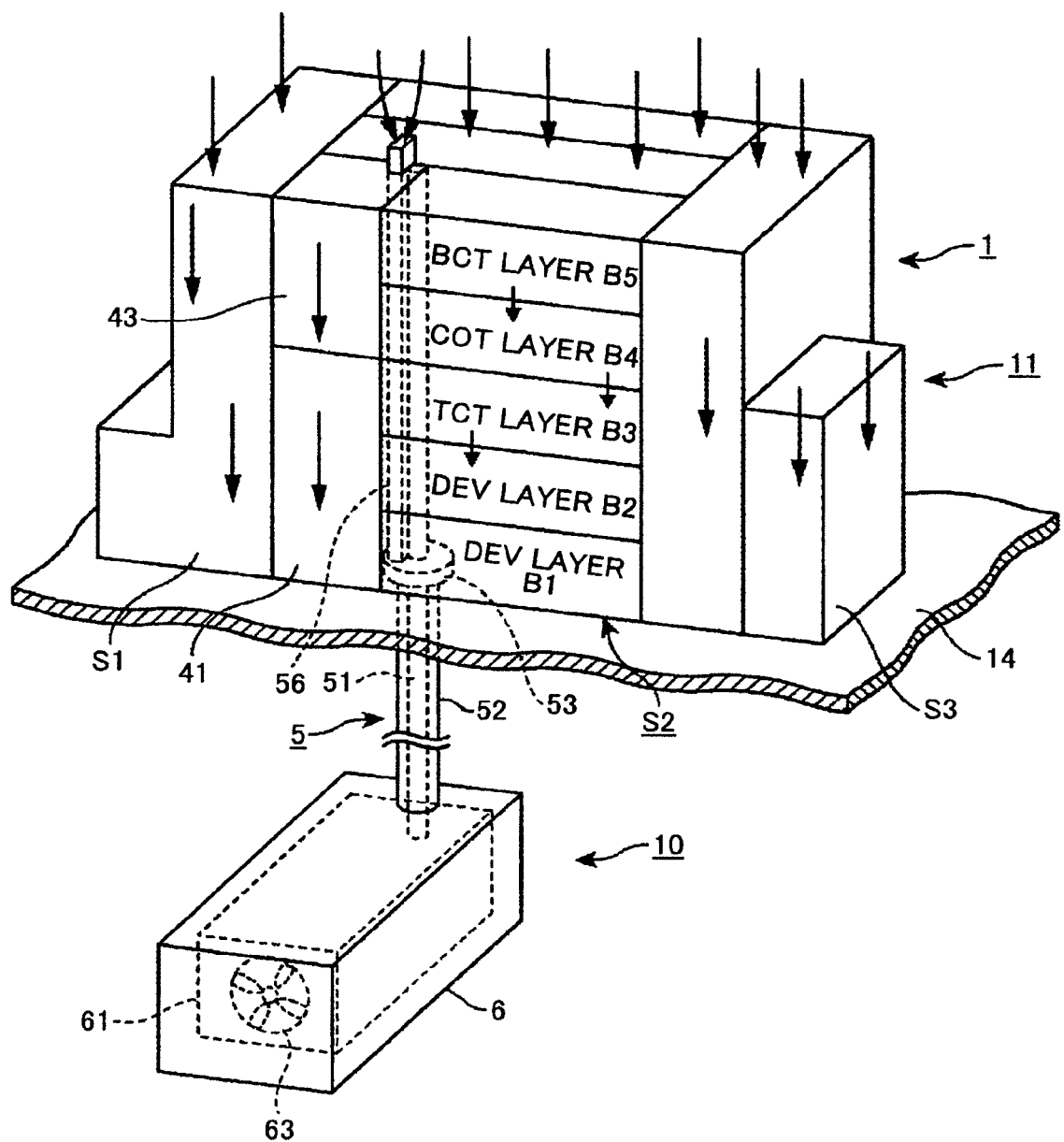
FIG. 3 is a first perspective view of the coating and developing apparatus of the embodiment of the present invention.
Figure 4:
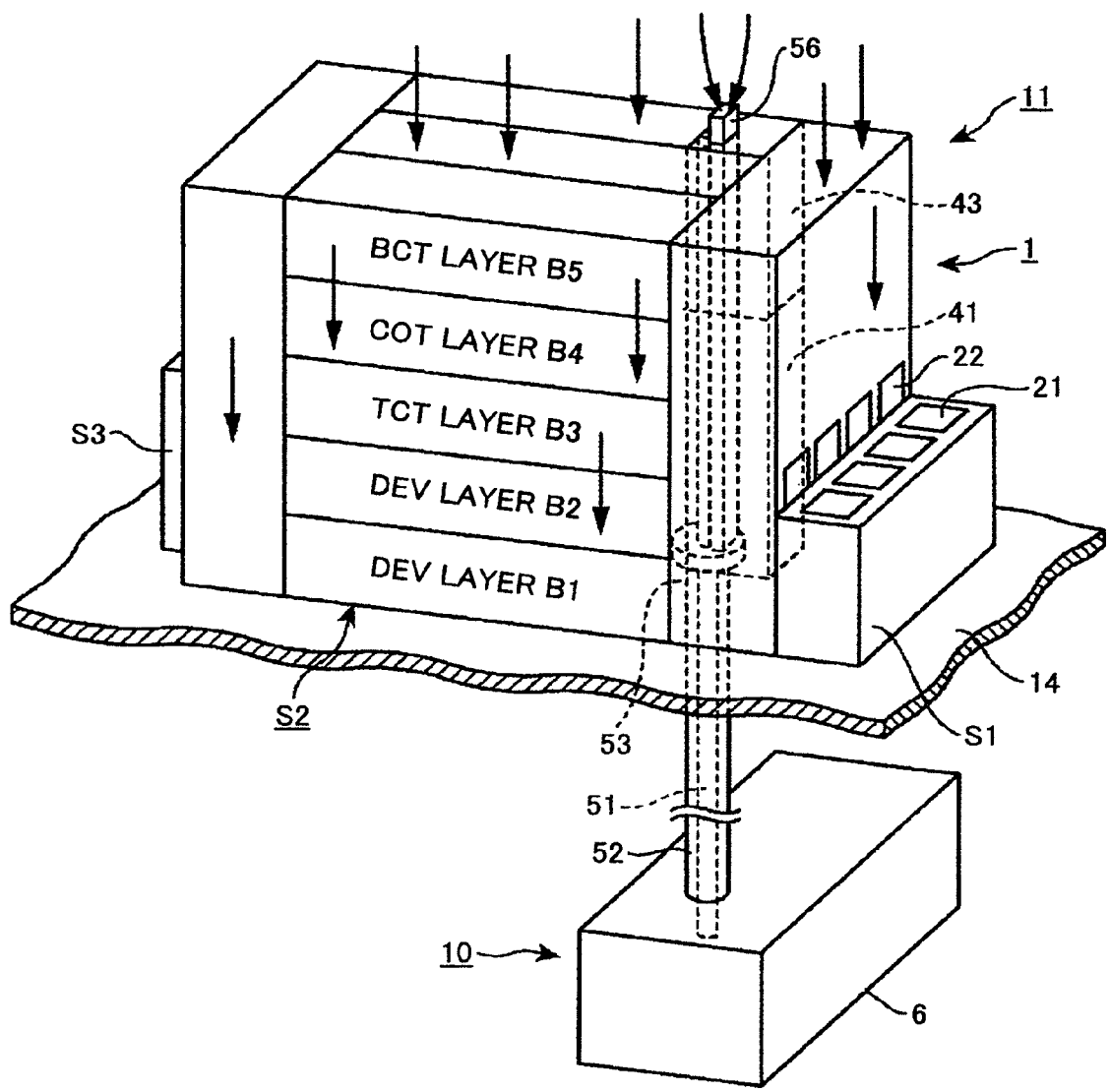
FIG. 4 is a second perspective view of the coating and developing apparatus of the embodiment of the present invention.
Figure 5:
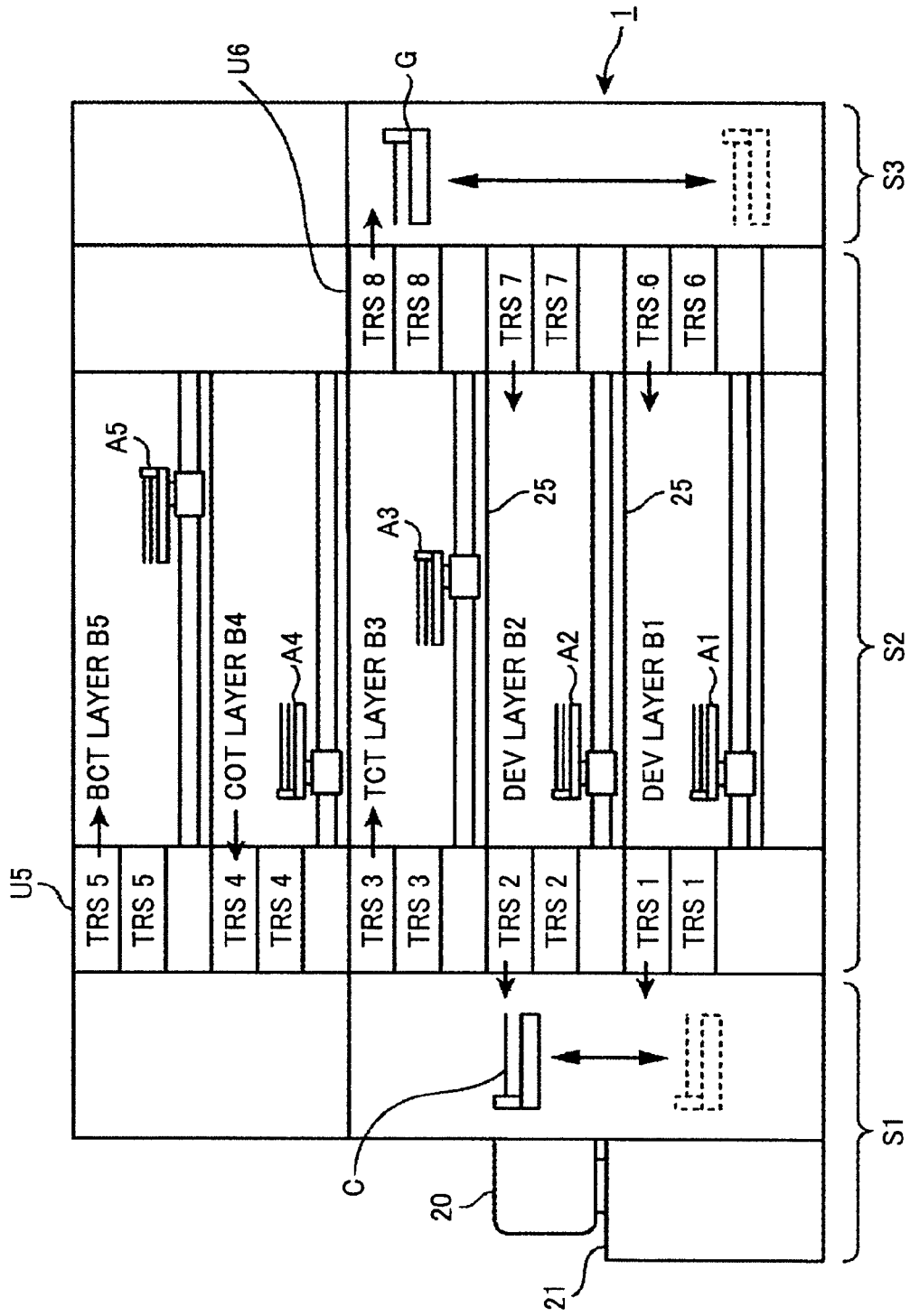
FIG. 5 is a vertical cross-sectional view of the coating and developing apparatus of the embodiment of the present invention.

Next, details of the coating and developing apparatus main body 1 are discussed with reference to FIG. 2 through FIG. 5. FIG. 2 is a plan view of the coating and developing apparatus of the embodiment of the present invention. FIG. 3 is a first perspective view of the coating and developing apparatus of the embodiment of the present invention. FIG. 4 is a second perspective view of the coating and developing apparatus of the embodiment of the present invention. FIG. 5 is a vertical cross-sectional view of the coating and developing apparatus of the embodiment of the present invention.

The coating and developing apparatus main body 1 includes a carrier block S1, a processing block S2, and an interface block S3. The carrier block S1 is configured to convey carriers 20 where thirteen substrates such as wafers W are sealed and received. The processing block S2 is formed by arranging plural blocks (five blocks B1 through B5 in this example) lengthwise. The exposing apparatus S4 is connected to the interface block S3.

Mounting stands 21, opening and closing parts 22, and a transfer arm C are provided in the carrier block S1. Plural carriers 20 can be mounted on each of the mounting stands 21. The opening and closing parts 22 are provided on front wall surfaces seen from the mounting stands 21.

The transfer arm C is configured to take the wafer W from the carrier 20 via the opening and closing part 22. The transfer arm C can move in an arrangement direction of the carriers 20, lift, and rotate with respect to a vertical shaft so that the wafer W can be transferred among transferring stages TRS1 and TRS2 of blocks B1 and B2.

The processing block S2 is connected to a side of the carrier block S1. The periphery of the processing block S2 is surrounded by a housing 24. In the processing block S2, a first block (DEV layer) B1, a second block (DEV layer) B2, a third block (TCT layer) B3, a fourth block (COT layer) B4, and a fifth block (BCT layer) B5 are provided from a lower side in this example.

The first block (DEV layer) B1 is configured to perform a developing process. The third block (TCT layer) B3 is configured to form a reflection prevention film (hereinafter "upper part reflection prevention film") formed on an upper layer side of the resist film. The fourth block (COT layer) B4 is configured to perform a coating process of resist liquid. The fifth block (BCT layer) B5 is configured to form a reflection prevention film (hereinafter "lower part reflection prevention film") formed on an lower layer side of the resist film.

These blocks B1 through B5 extend from the carrier block S1 to the interface block S3. Here, the DEV layers B1 and B2 correspond to blocks for developing. The TCT layer B3, the COT layer B4, and the BCT layer B5 correspond to blocks for forming a coating film made of a sensitized material such as resist. Adjacent blocks are separated by a partition plate (base body) 25.

Next, structures of the first block B1 through fifth block B5 are discussed.

In this embodiment, a large number of common parts are provided in the first block B1 through fifth block B5 and each block B1 through B5 is formed with the substantially same layout. Accordingly, in the following explanations, the DEV layer B1 is discussed as an example with reference to FIG. 2.

At the center part of the DEV layer B1, a conveyance path R1 for conveying the wafer W is formed in a horizontal direction, more specifically, in a length direction of the DEV layer B1 (in a Y direction in FIG. 2), so that the carrier block S1 and the interface block S3 are connected to each other.

At the right side of the conveyance path R1 seen from the carrier block side S1, a developing unit 3 as a liquid processing unit is provided along the conveyance path R1. The developing unit 3 includes plural liquid processing part configured to perform a coating process with a developing liquid. In addition, at a left side of the DEV layer B1, four shelf units U1, U2, U3, and U4 are provided along the conveyance path R1. The shelf units U1, U2, U3, and U4 are multi-stages of a thermal system processing unit of a heating and cooling system. Thus, the developing unit 3 and the shelf units U1 through U4 are arranged so as to face each other via the conveyance path R1.

The shelf units U1 through U4 are formed by stacking two thermal system processing units configured to perform a pre-process and a post-process of a process implemented by the developing unit 3. An exhaust unit is provided under the shelf units U1 through U4 so as to exhaust the air in the block B1.

The thermal system processing unit discussed above includes a heating unit, a cooling unit, and others. For example, the heating unit heats the wafer W after an exposing process or heats the wafer W after a developing process so that the wafer W is dried. The cooling unit controls the wafer at a designated temperature after the process by the heating unit.

Figure 6:
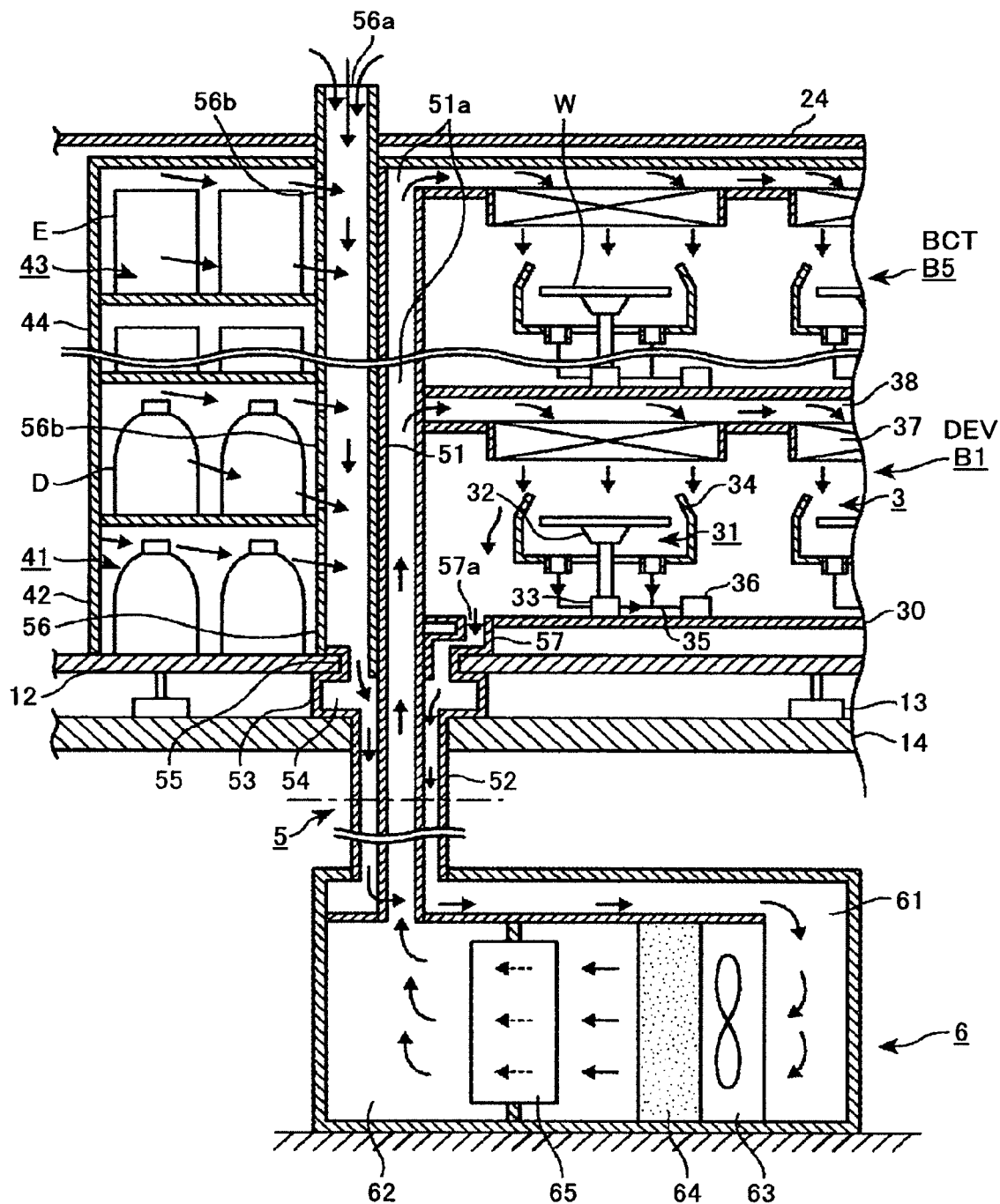
FIG. 6 is a vertical cross-sectional view showing a pipe structure of the coating and developing apparatus of the embodiment of the present invention.

A chemical unit 41 is provided at the front of the developing unit 3. As shown in FIG. 6, the chemical unit 41 is mounted, for example, on the DEV layer B1 through the TCT layer B3 and includes the housing 42, for example. Here, FIG. 6 is a vertical cross-sectional view showing a pipe structure of the coating and developing apparatus of the embodiment of the present invention.

Containers D are received in the housing 42. The containers D contain various kinds of chemical solutions supplied to the wafers W by the liquid processing unit of each layer, such as developing liquid and resist liquid.

An electric unit 43 is stacked on the chemical unit 41 so as to ride the COT layer B4 and the BCT layer B5. The electric unit 43 includes, for example, a housing 44. Various kinds of the electric apparatuses E for driving each driving part of the coating and developing apparatus 1 are received in the housing 44.

Structures of the developing unit 4, the chemical unit 41 and the electric unit 43 are discussed below.

An area neighboring the carrier block S1 of the conveyance path R1 is a first wafer transferring area R2. The shelf unit U5 is provided in a position where a main arm A1 and the transfer arm C can access, and a transferring arm D1 that is a lifting and conveyance part configured to transfer the wafer W to the shelf unit 5 are provided in the first wafer transferring area R2, as shown in FIG. 2 and FIG. 5.

In the shelf unit U5, for example, two transferring stages TRS1 are stacked on the DEB layer B1. The transferring stage TRS1 includes a mechanism for controlling the temperature of the wafer W at a designated temperature. In addition, in order to transfer the wafer W with each arm, a pin is provided so as to raise or lower the wafer W at the stage.

In this example, as shown in FIG. 5, two transferring stages TRS2 through TRS5 are provided at each of the blocks B2 through B5. The wafer W is transferred between the transferring stages TRS2 through TRS5 and main arms A2 through A5 and the transferring arm D1.

The movable and liftable transferring arm D1 is provided so as to move from the block B1 through block B5 and transfer the wafer W to the transferring stages TRS1 through TRS5. In addition, the transferring stages TRS1 and TRS2 are configured to transfer the wafer W with the transferring arm C in this example.

Furthermore, an area neighboring the interface block S3 of the conveyance path R1 of the DEV layer B1 is a second wafer transferring area R3. A shelf unit U6 is provided in this area R3. As shown in FIG. 5, a transferring stage TRS6 is provided at the shelf unit U6. The wafer W is transferred between the transferring stage TRS6 and the main arm A1 and an interface arm G.

In addition, in this example, as shown in FIG. 5, two transferring stages TRS7 and TRS8 are provided at the shelf units U6 of each of the blocks B2 and B3. The main arms A2 and A3 and the interface arm G can access the transferring stages TRS7 and TRS8. Structures of the transferring stages TRS7 and TRS8 are the same as that of the above-mentioned transferring stage TRS1.

The exposing apparatus S4 is connected to a depth side of the shelf unit U6 of the processing block S2 via the interface block S3. The movable, liftable, and routable interface arm G is provided at the interface block S3 with respect to a vertical axis. The interface arm G is configured to transfer the wafer W to the shelf unit U6 of the processing block S2 and the exposing apparatus S4. The above-mentioned transferring arm D1 has the same structure as that of the interface arm G other than not rotating with respect to the vertical axis.

Next, other unit blocks are discussed. The DEV layer B2 has the same structure as that of the above-mentioned DEV layer B1. The BCT layer B2, the COT layer B4, and the TCT layer B3 have the same structures as that of the DEV layer B1. The BCT layer B2, the COT layer B4, and the TCT layer B3 are different from the DEV layer B1 in that resist or chemical solution for forming the reflection prevention film instead of the developing liquid is used and a method for coating the chemical solution is different in the liquid processing unit corresponding to the developing unit 3 and processing conditions in the heating system unit and the cooling system unit are different.

Next, the developing unit 3, other liquid processing units, the chemical unit 41, the electric unit 43, and the pipe part shown in FIG. 1 are discussed with reference to FIG. 6 and FIG. 7.

The pipe part 5 includes an air supplying pipe 51 and an air suction pipe 52. The air supplying pipe 51 is configured to supply the air to the coating and developing apparatus main body 1. The air suction pipe 52 is configured to supply the air of the clean room 11 where the coating and developing apparatus main body 1 is provided and the processing atmosphere of the developing unit 3 of the coating and developing apparatus main body 1, to the air supplying part 6.

Under the floor 14 on which the coating and developing apparatus main body 1 is provided, the air suction pipe 52 covers the air supplying pipe 51 so that a double-pipe structure is formed. The air from the coating and developing apparatus main body 1 to the air supplying part 6 flows in the periphery of the air supplying pipe 51 as indicated by an arrow in FIG. 6.

Figure 7:
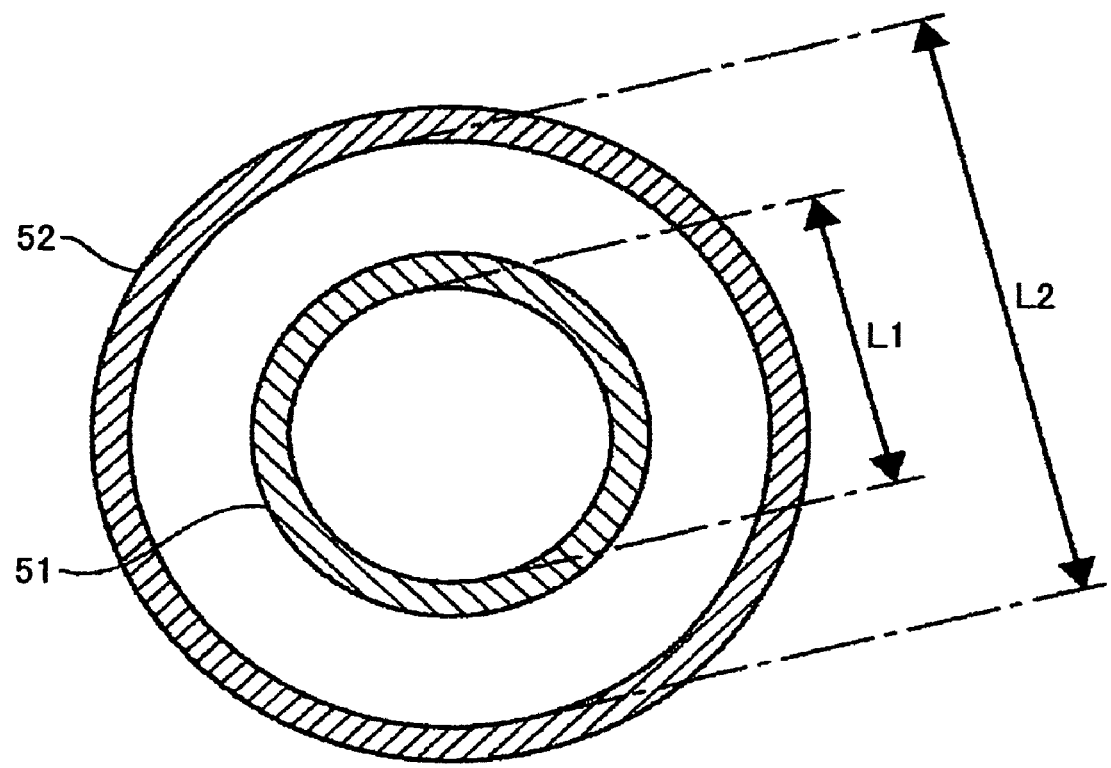
FIG. 7 is a cross-sectional view of a pipe.

FIG. 7 is a cross-sectional view of the pipe part 5 taken along a dotted line in FIG. 6. The internal diameter of the air supplying pipe 51 indicated as L1 is, for example, approximately 150 mm through 200 mm. The internal diameter of the air suction pipe 52 indicated as L2 is, for example, approximately 250 mm through 300 mm.

Figure 8:
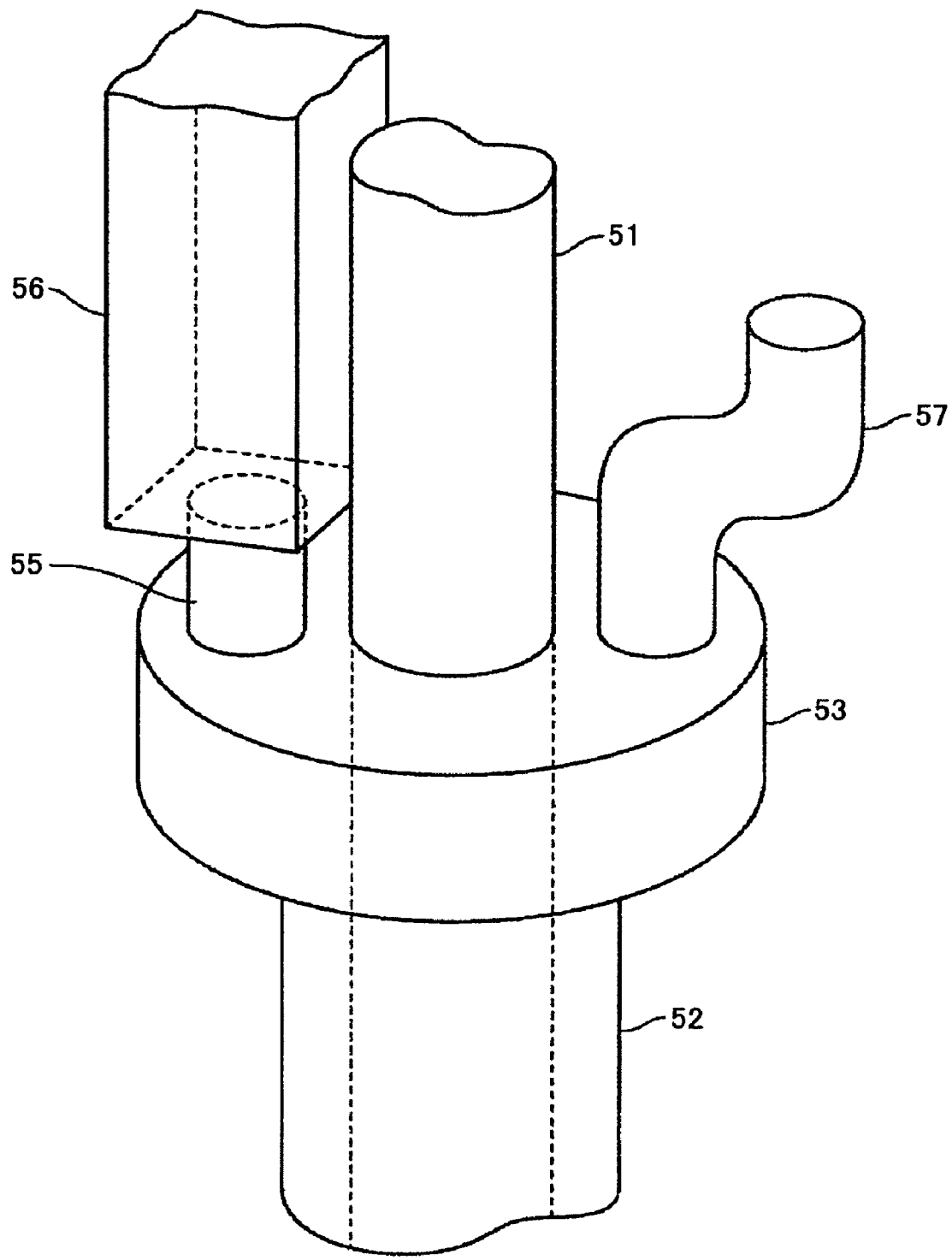
FIG. 8 is a perspective view showing a periphery of an extended diameter part of the pipe.

Next, details of the pipe part 5 are further discussed with reference to FIG. 8 in addition to FIG. 6 and FIG. 7. Here, FIG. 8 is a perspective view showing a periphery of an extended diameter part of the pipe part 5.

The air supplying pipe 51 and the air suction pipe 52 extend upward. For example, the air suction pipe 52 forms an extended diameter part 53 between the floor 14 and the coating and developing apparatus main body 1. A ring-shaped vent room 54 is formed inside of the extended diameter part 53.

An end of a connecting pipe 55 is connected to the extended diameter part 53. The connecting pipe 55 communicates with the vent room 54. Another end of the connecting pipe 55 is an end of a standing suction pipe 56 extending upward along the chemical unit 41 and the electric unit 43.

Another end of the standing suction pipe 56 pierces the housing 24 of the processing block S2 so that an opening 56a is formed in a position higher than the coating and developing apparatus main body 1. Air flowing down to the clean room 11 via the opening 56a is suctioned by the standing suction pipe 56.

In addition, plural suction openings 56b are formed in a side wall of the standing suction pipe 56 toward the chemical unit 41 and the electric unit 43. For example, the suction openings 56b communicate with an internal space of the housing 42 of the chemical unit 41 and an internal space of the housing 44 of the electric unit 43.

As discussed below, when the air is suctioned by the air supplying part 6 via the opening 56a, exhaustion of the inside of the housing 42 of the chemical unit 41 and the inside of the housing 44 of the electric unit 43 are performed via the suction openings 55b. The suction opening 56b corresponds to a second diverging path and a third diverging path.

An end of an atmosphere suction pipe 57 as a first diverging pipe communicating with the vent room 54 is connected to the extended diameter part 53. Another end of the atmosphere suction pipe 57 is connected to, for example, a lower part of the developing unit 3 of the DEV layer B1. As discussed above, plural liquid processing parts 31 are provided in the housing 30 of the developing unit 3.

The liquid processing part 31 holds the wafer W. The liquid processing part 31 includes a chuck configured to rotate the wafer W and a driving part 33 configured to drive the chuck 32. A cup 34 having an opening provided at an upper side is provided in the periphery of the chuck 32 so as to prevent scattering of liquid. The cup 34 includes an exhaust pipe 35 and an exhausting part 36 configured to suction the inside of the cup 34, and a drain mechanism not shown.

An end part 57a of the atmosphere pipe 57 is a suction opening formed in the housing 30. For avoiding FIG. 3 and FIG. 4 being too complex, illustration of the atmosphere suction pipe 57 is omitted in FIG. 3 and FIG. 4.

A cleaning filter 37 is provided at an upper part of each of the liquid processing parts 31. The cleaning filter 37 removes particle contained in the air so that the air is cleaned. The cleaned air is made to flow down so as to be supplied to the periphery of the liquid processing part 31. A flow path 38 is formed at the upper part of the cleaning filter 37 so as to supply the air to the cleaning filter 37.

As discussed above, the liquid processing units of the blocks B1 through B5 have the substantially same structures other than the suction opening 57a. Accordingly, the liquid processing unit of the block B5 in FIG. 6 (power part reflection prevention film forming unit) is indicated by numerical reference 3 like the developing unit and each part of the liquid processing part is indicated by the same numerical reference of each part of the developing unit 3.

On the floor 14, the above-mentioned air supplying pipe 51 is provided in parallel with the standing suction pipe 56. The air supplying pipe 51 extends upward so as to ride the DEV layer B1 through the BCT layer B5. The air supplying pipe 51 communicates with, via a contact hole 51a provided in its side wall, the flow path 38 of each of the liquid processing units 3 of the above-mentioned DEV layer B1 through BCT layer B5.

In the liquid processing units 3 of the Dev layer B1 through the BCT layer B5, the air flowing in the air supplying pipe 51 flows in the flow path 38 and is made to flow down in the housing 30 via the cleaning filter 37. The air made to flow down in the developing unit 3 of the DEV layer B1 flows in the atmosphere suction pipe 57 via the suction opening 57a.

Next, a structure of the air supplying part 6 is discussed.

The air supplying part 6 includes a divided flow path 61 and an air supplying room 62. A base end part of the air suction pipe 52 is connected to the flow path 61 and a base end part of the air supplying pipe 52 is connected to the air supplying room 62.

A fan 63 as a ventilation part is provided in the flow path 61. This fan 63 takes the air in the air suction pipe 52 to the flow path 61 and discharges the air to a downstream side of the flow path 61. A chemical filter 64 and an air temperature and moisture control part 65 are provided at the downstream side of the fan 63 in this order.

As discussed below, the chemical filter 64 removes a chemical material such as compositions of the chemical solution contained in the suctioned atmosphere of the chemical unit 41 at the time when the suctioned atmosphere flows through the flow path 61.

The air temperature and moisture control part 65 corresponds to a temperature control part and a moisture control part of claims below. The air temperature and moisture control part 65 includes a temperature sensor, a moisture sensor, a humidifier, a heater, or the like. The air temperature and moisture control part 65 receives a control signal from a control part 100 discussed below and control the temperature and moisture of the air flowing from the upstream flow path 61 at the designated temperature and moisture content so that the air whose temperature and moisture are controlled is supplied to the air supplying room 62 provided at the downstream of the flow path 61. The air supplied to the air supplying room 62 flows into the air supplying pipe 51 so as to be supplied to the coating and developing apparatus main body 1.

The coating and developing apparatus main body 1 includes a control part 100. This control part 100 includes a program storage part formed by, for example, a computer. A program is stored in the program storage part.

The program is made of software containing commands for implementing operations of the coating and developing apparatus that include temperature control of the wafer in the heating and cooling units, a deposition process for the wafer W, a hydrophobic process for the wafer W, transferring the wafer W between the units, supply of the air to the coating and developing apparatus main body 1, suctioning the air from the clean room 11 to the air supplying part 6, and others.

The program is read by the control part 100 so that the control part 100 controls operations of the coating and developing apparatus. This program is stored in the program storage part in a state where the program is in a recording medium such as a hard disk, a compact disk, a magnet optical disk, and a memory card.

Figure 9:
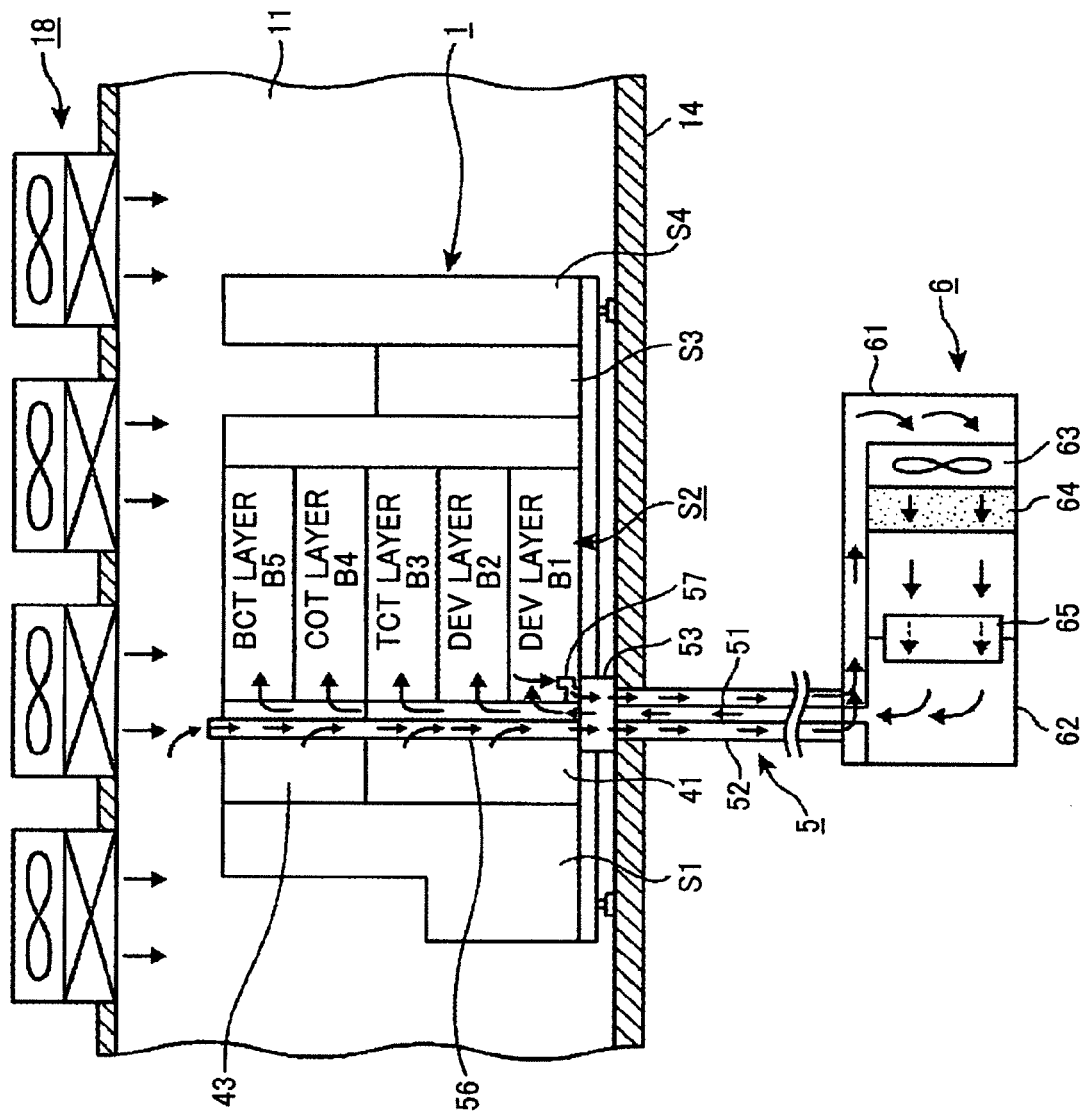
FIG. 9 is a schematic view showing a flow of air of the coating and developing apparatus of the embodiment of the present invention.

Next, the operations of the coating and developing apparatus are discussed with reference to FIG. 9. Here, FIG. 9 is a schematic view showing a flow of the air of the coating and developing apparatus of the embodiment of the present invention.

First, air flows from the FFE 18 of the clean room 11 where the coating and developing apparatus main body 1 is provided so that the down flow of the air is formed in the clean room 11. After that, the heater and the humidifier included in the air temperature and moisture control part 65 of the air supplying part 6 are operated so that a stand-by situation is formed in order to control the temperature and moisture of the supplied air to a designated temperature and moisture content.

When the air temperature and moisture control part 65 reaches in a state where the temperature and moisture of the supplied air can be controlled, the fan 63 of the air supplying part 6 is operated.

As a result of this, the air flowing down in the clean room via the opening part 65*a* of the standing suction pipe 56 is suctioned by the standing suction pipe 56. In addition, the atmosphere in each of the housings 42 and 44 of the chemical unit 41 and the electric unit 43 are suctioned to the standing suction pipe 56 via the suction opening 56*b* of the standing suction pipe 55. Furthermore, the air in the housing 30 of the developing unit 3 is suctioned through the developing unit 3 of the DEV layer B1 of the coating and developing apparatus main body 1 via the suction opening 57*a* of the atmosphere suction pipe 57.

The air flowing in the atmosphere suction pipe 57 and the standing suction pipe 56 flows in the air suction pipe 52 via the extended diameter part 53 and toward the downstream side of the suction pipe 52 so as to flow in the flow path 61 of the air supplying part 6 under the floor.

The air flowing in the flow path 61 passed through the chemical filter 64 of the air supplying part 6 so that the chemical materials contained in the air are removed. In addition, the air passes through the air temperature and moisture control part 65 so that the moisture and temperature of the air is controlled to the designated temperature and moisture content and the air is supplied to the air supplying pipe 51.

The air supplied to the air supplying pipe 51 so that the temperature and moisture of the air is controlled flows in each of the liquid processing units 3 of each of the blocks B1 through B5 of the coating and developing apparatus main body 1 so as to down flow from the cleaning filter 37 provided in each of the liquid processing units 3 to each of the liquid processing parts 31 of the liquid processing units 3.

After that, the carrier 20 is conveyed to the carrier block S1. The wafer W is taken from this carrier 20 by the wafer transfer arm C. The wafer is transferred, by the transfer arm C, from the transferring stage TRS1 or TRS2 of the shelf unit 5 to the main arm A5 of the BCT layer B5, via the transferring arm D1 and the transferring stage TRS5 of the shelf unit U5 in this order.

In the BCT layer B5, the wafer W is transferred by the main arm A5 from the cooling unit to the transferring stage TRS5 of the shelf unit U5 via the reflection prevention film forming unit that is a liquid processing unit and the heating unit in this order, so that the lower part reflection prevention film is formed.

Next, the wafer W at the transferring stage TRS5 is conveyed to the transferring stage TRS4 of the COT layer B4 by the transferring arm D1 and then transferred to the main arm A4 of the COT layer B4. At the COT layer B4, the wafer W is, by the main arm A4, transferred from the cooling unit to the heating unit via the resist coating unit that is a liquid processing unit so that the resist film is formed on an upper layer of the lower part reflection prevention film. After that, the wafer W is conveyed to a peripheral edge exposing unit so that a peripheral edge part is exposed and the wafer W is transferred to the transferring stage TRS4 of the shelf unit 5.

Next, the wafer W at the transferring stage TRS45 is, by the transferring arm D1, conveyed to the transferring stage TRS3 of the TCT layer B3 so as to be transferred to the main arm A3 of the TCT layer B3.

At the TCT layer B3, the wafer W is transferred, by the main arm A3, from the cooling unit to the heating unit via the reflection prevention film unit that is a liquid processing unit so that the upper part reflection prevention film is formed on the upper layer of the resist film. After that, the wafer W is conveyed to the transferring stage TRS 8 of the shelf unit U6. Then, the wafer W is conveyed to the exposing apparatus S4 by the interface arm G so that a designated exposing process is applied.

The wafer W after the exposing process is applied is conveyed to the transferring stage TRS6 or TRS7 of the shelf unit U6 by the interface arm G. The wafer W at the transferring stage TRS6 (TRS7) is taken by the main arm A1 (A2) of the DEV layer B1 (B2).

At the DEV layer B1 (B2), the wafer W is conveyed from the heating unit included in the shelf unit U1 through U4 to the cooling unit, via the cooling unit, the developing unit, and the heating unit in this order, so that a designated developing process is applied.

After that, the wafer to which the developing process is applied is conveyed to the transferring stage TRS1 (TRS2) of the shelf unit 5 so as to be returned to an original carrier 20 mounted on the carrier block S1 by the transferring arm C. For example, after processing the wafers W of a designated lot number is ended, the fan 63 is stopped and electric power supply to the air temperature and moisture control part 65 is stopped.

According to the above-discussed coating and developing apparatus 1, when the air of the clean room whose temperature and moisture content are relatively stable is taken in so that the temperature and moisture are controlled and the air is supplied to the liquid processing unit 3 configured to perform the liquid process to the wafer W, a double-pipes structure having the air suction pipe 52 for taking in the air in the clean room 11 and the air supplying pipe 51 for supplying the air whose temperature is controlled to the liquid processing unit is provided under the floor of the clean room 11.

Therefore, compared to a structure where the air supplying pipe 51 and the air suction pipe 52 are provided in parallel, it is possible to reduce the space for providing the air supplying pipe 51 and the air suction pipe 52. Accordingly, even if there is an obstacle to providing the air supplying pipe 51 and the air suction pipe 52 such as a pipe system for providing power of the coating apparatus under the floor of the clean room 11, it is possible to pass the air supplying pipe 51 and the air suction pipe 52 through the gap formed in this pipe system. Therefore, it is possible to make the construction for providing air supplying pipe 51 and the air suction pipe 52 easy.

By covering the air supplying pipe 51 with the air suction pipe 52, it is possible to prevent influence of the atmosphere under the floor of the coating and developing apparatus main body 1 on the air flowing through the air supplying pipe 51. Accordingly, it is possible to prevent the change of the temperature and moisture content of the air until the air is supplied to each of the liquid processing units 3. Hence, it is possible to control the atmosphere of each of the liquid processing units 3 with high precision.

In addition, the opening part 56*a* of the standing suction pipe 56 is provided in a position higher than the developing apparatus main body 1. Therefore, it is possible to prevent temperature change due to heat generated from the coating and developing apparatus main body 1 or influence of particle contaminants on the air taken in by the opening part 56*a*. Hence, heavy workloads on the air temperature and moisture control part 65, the chemical filter 64, and the cleaning filter 37 can be prevented.

Accordingly, consumption of electric power that the air temperature and moisture control part 65 requires for temperature and moisture control can be reduced so that the number of exchanges of the chemical filter 64 and the cleaning filter 37 can be decreased.

In addition, since the atmosphere of the chemical unit 41 is suctioned during the process of the wafer W, it is possible to prevent volatilized gas of various chemicals from being diffused to the periphery of the chemical unit 41. As a result of this, by removal of the volatilized chemical, it is possible to prevent influence on the process atmosphere of the wafer W in each of the processing units.

Furthermore, since the atmosphere of the electric unit 43 is suctioned during the process of the wafer W, it is possible to prevent diffusion of the heat of the electric unit 43 to the periphery and prevent the particles from the driving part of the fan or the like included in the electric power supply of the electric unit 43 from discharging to diffuse to the coating and developing apparatus main body 1. Accordingly, it is possible to prevent the processing atmosphere of the wafer W of each process unit from being influenced by the heat or the particles.

Figure 10:
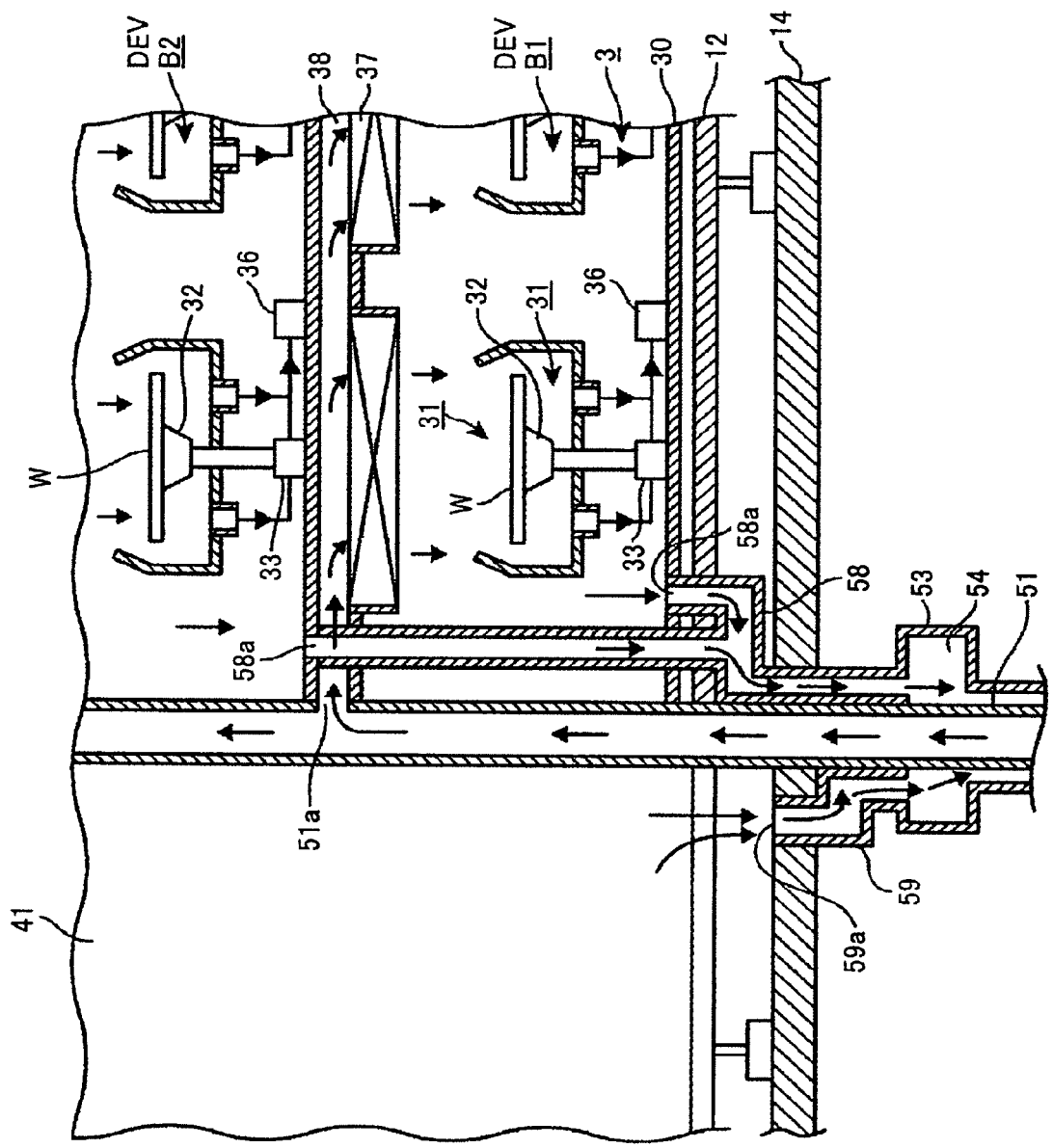
FIG. 10 is a cross-sectional view showing a pipe structure of a coating and developing apparatus of another embodiment of the present invention.
Figure 11:
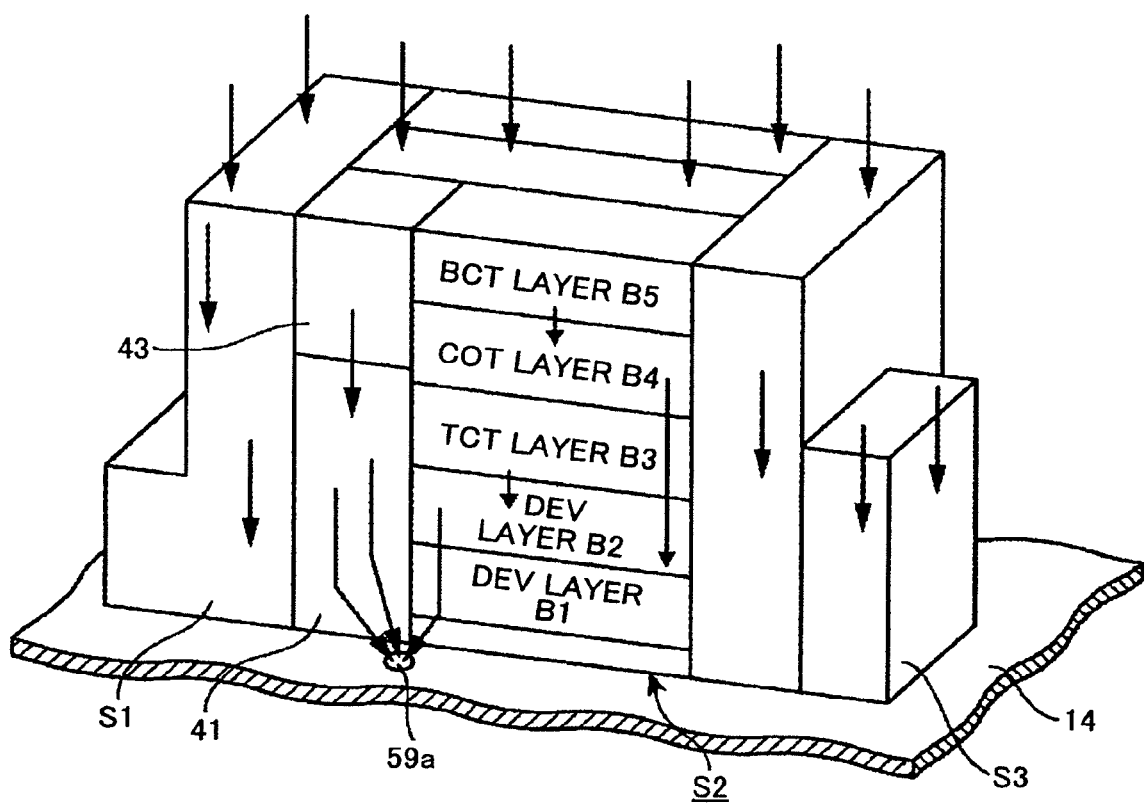
FIG. 11 is a perspective view of a main body of the coating and developing apparatus shown in FIG. 10.

FIG. 10 is a cross-sectional view showing a pipe structure of a coating and developing apparatus of another embodiment of the present invention. FIG. 11 is a perspective view of a main body of the coating and developing apparatus shown in FIG. 10.

In FIGS. 10 and 11, parts that are the same as the parts shown in FIG. 1 through FIG. 9 are given the same reference numerals, and explanation thereof is omitted.

The end part of the atmosphere suction pipe 58 connected to the extended diameter part 53 of the pipe part 5 of this example is diverged and connected to each developing unit 3 of each of the blocks B1 through B2 so that the air in the housing 30 can be suctioned. The atmosphere suction pipe may be further diverged so that the end part may be connected to not only the developing unit but also the liquid processing units of B2 through B5.

Instead of the standing suction pipe 56, the suction pipe 59 is connected to the extended diameter part 53 in this example. As shown in FIG. 11, the end part of the suction pipe 59 opens to the floor 14 so that the opening part 59a is formed. In addition, by operating the fan 63, the air down flow to the clean room 11 via the opening part 59a flows in the suction pipe 59 and the air suction pipe 52 under the floor.

Figure 12:
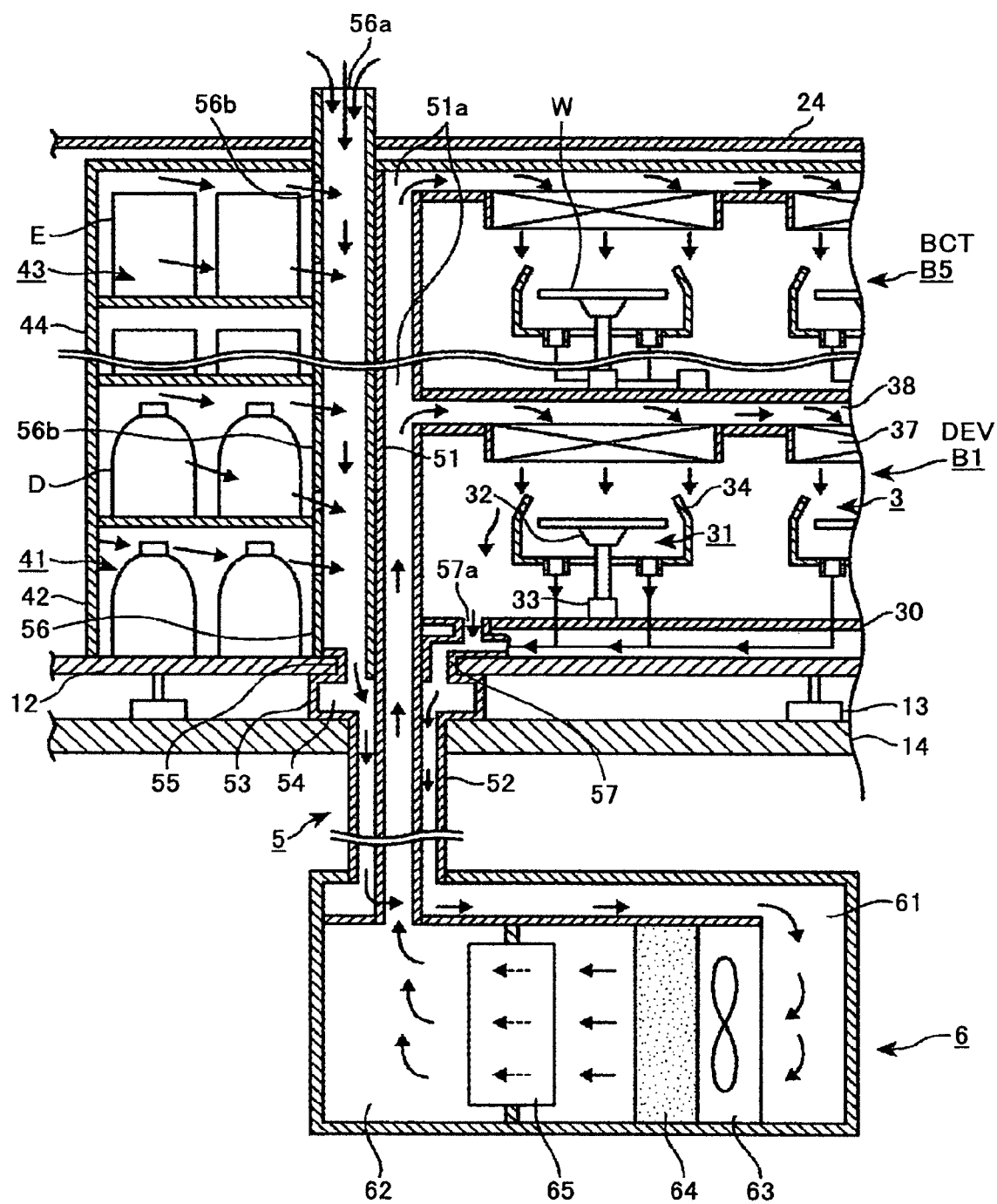
FIG. 12 is a cross-sectional view showing a pipe structure of a coating and developing apparatus of another embodiment of the present invention.

FIG. 12 is a cross-sectional view showing a pipe structure of a coating and developing apparatus of another embodiment of the present invention.

In this example, while a coating and developing apparatus is formed in the same way as the above-discussed coating and developing apparatus, the discharge opening 57a of the cup 34 of the developing unit 3 of the DEV layer B1 is connected to the atmosphere suction pipe 57. By operating the fan 63, the air in the developing unit 3 flows through the suction pipe 52 under the floor via the discharge openings 57a and the atmosphere suction pipe 57.

According to the above-discussed embodiments of the present invention, it is possible to provide A liquid processing apparatus, including an apparatus main body having a liquid processing unit provided in a clean room and configured to supply a chemical solution to a substrate and perform a liquid process; a heating unit configured to perform a heating process on the substrate before or after the liquid process is performed by the liquid processing unit; and a transferring part configured to transfer the substrate between the heating unit and the liquid processing unit; a power room having an atmosphere separated from the clean room by a partition member; an air suction path configured to suction an air in the clean room and take the air into the power room; a temperature control part provided in the power room and configured to control at least a temperature of the air taken in via the air suction path; an air supplying path configured to supply the air from the temperature control part to the liquid processing unit; a ventilation part configured to take the air from the air suction path and supply the air via the air supplying path; and a cleaning filer configured to clean the air taken in from the air suction path; wherein the air suction path and the air supplying path are formed by an internal space of an internal pipe of a double pipe or a space between the internal pipe and an external pipe of the double pipe.

The liquid processing apparatus may further include a moisture control part provided in the power room and configured to control moisture in the air taken in via the air suction path. The power room may be formed under a floor of a room where the apparatus main body is provided. The number of the liquid processing units may be plural; one liquid processing unit may be a resist coating unit configured to coat resist liquid onto the substrate; and another liquid processing unit may be a developing unit configured to supply developing liquid to the substrate and develop the resist. An opening for jetting the air may be provided at a ceiling of the clean room; and an opening may be formed at the air suction path in a position having the same height as the apparatus main body or a position higher than the apparatus main body.

The liquid processing apparatus may further include a first divergence path having one end opening to the coating unit and another end connected to the air suction path and configured to suction the air supplied to the liquid processing unit. The apparatus main body may include an electric unit having an electric apparatus; and the liquid processing apparatus may further include a second divergence path having one end opening to the electric unit and another end connected to the air suction path and configured to suction the air supplied to the electric unit. The apparatus main body may include a chemical unit where the chemical solution is stored; and the liquid processing apparatus further may include a third divergence path having one end opening to the chemical unit and another end connected to the air suction path and configured to suction an atmosphere of the chemical unit. The liquid processing apparatus may further include a chemical filter configured to remove chemical solution composition contained in the air taken in via the air suction path.

According to the above-discussed embodiments of the present invention, it is also possible to provide a liquid processing method using a liquid processing apparatus, the liquid processing apparatus including an apparatus main body, the apparatus main body having a liquid processing unit provided in a clean room and configured to supply a chemical solution to a substrate and perform a liquid process; a heating unit configured to perform a heating process on the substrate before or after the liquid process is performed by the liquid processing unit; and a transferring part configured to transfer the substrate between the heating unit and the liquid processing unit; the liquid processing method including a step of suctioning air in the clean room and taking the air into a power room having an atmosphere separated from the clean room by a partition member; a step of controlling a temperature of the air taken in via the air suction path in the power room; a step of supplying the air whose temperature is controlled to the liquid processing unit; a step of suctioning the air from the air suction path and supplying the air via the air supplying path; and a step of cleaning the air taken in from the air suction path; wherein the air suction path and the air supplying path are formed by either an internal space of an internal pipe of a double pipe or a space between the internal pipe and an external pipe of the double pipe.

The liquid processing method may further include a step of controlling moisture in the air taken in via the air suction path in the power room. The power room may be formed under a floor of a room where the apparatus main body is provided.

The number of the liquid processing units may be plural; one liquid processing unit may be a resist coating unit configured to coat resist liquid onto the substrate; and another liquid processing unit may be a developing unit configured to supply developing liquid to the substrate and develop the resist.

An opening for jetting the air may be provided at a ceiling of the clean room; and a step of suctioning the air in the clean room from the air suction path and taking the air in the power room may be performed in a position having the same height as the apparatus main body or a position higher than the apparatus main body.

The liquid processing method may further include a step of suctioning the air supplied to the liquid processing unit to the air suction path. The apparatus main body may include an electric unit having an electric apparatus; and the liquid processing method may further include a step of suctioning an atmosphere of the electric unit to the air suction path. The apparatus main body may include a chemical unit where the chemical solution is stored; and the liquid processing method may further include a step of suctioning an atmosphere of the chemical unit to the air suction path. The liquid processing method may further include a step of removing a chemical solution composition contained in the air suctioned into the air suction path from the chemical unit.

According to the above-discussed embodiments of the present invention, it is also possible to provide a recording medium where a computer program is stored, the computer program used for a liquid processing apparatus, the liquid being processing apparatus including an apparatus main body, the apparatus main body having a liquid processing unit provided in a clean room and configured to supply a chemical solution to a substrate and perform a liquid process; a heating unit configured to perform a heating process on the substrate before or after the liquid process is performed by the liquid processing unit; and a transferring part configured to transfer the substrate between the heating unit and the liquid processing unit; the computer program implementing a liquid processing method, the liquid processing method including a step of suctioning air in the clean room and taking the air in a power room having an atmosphere separated from the clean room by a partition member; a step of controlling a temperature of the air taken in via the air suction path in the power room; a step of supplying the air whose temperature is controlled to the liquid processing unit; a step of suctioning the air from the air suction path and supplying the air via the air supplying path; and a step of cleaning the air taken in from the air suction path; wherein the air suction path and the air supplying path are formed by either an internal space of an internal pipe of a double pipe or a space between the internal pipe and an external pipe of the double pipe.

According to the above-discussed liquid processing apparatus, when the air of the clean room whose temperature and moisture are relatively stable is taken in so that the temperature and moisture are controlled and the air is supplied to the liquid processing unit configured to perform the liquid process to the wafer, a double pipes structure having the air suction pipe for taking in the air in the clean room and the air supplying pipe for supplying the air whose temperature is controlled to the liquid processing unit is provided under the floor of the clean room.

Therefore, as compared to a structure where the air supplying pipe and the air suction pipe are provided in parallel, it is possible to reduce the space for providing the air supplying pipe and the air suction pipe. Accordingly, even if there is obstacle for providing the air supplying pipe and the air suction pipe such as a pipe system for providing a power of the coating apparatus under the floor of the clean room, it is possible to pass the air supplying pipe and the air suction pipe through the gap formed in this pipe system. Therefore, it is possible to make the construction for providing air supplying pipe and the air suction pipe easy.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

For example, in the above-discussed embodiments, for example, the flow amount $\alpha$ of the air supplied to the air supplying part 6 by the air suction pipe 52 and the flow amount $\beta$ of the air supplied to the coating and developing apparatus main body 1 by the air supplying pipe 51 are equal to each other. However, the present invention is not limited to this.

In a case where the flow amount $\alpha$ is smaller than the flow amount $\beta$, a mechanism for supplying the air to the flow path 61 of the air supplying part 6 or the air supplying part 6 may be provided. In the above-discussed embodiment, in a case where a collection rate where the ratio of the flow amount $\alpha$ to the flow amount $\beta$ is 50%, for example, a draft air amount of the air supplying pipe 51 is 20 $m^3$/min through 25 $m^3$/min.

The air supplying part 6 is not limited to being provided under the floor of the clean room 11. For example, the air supplying part may be provided in a space separated from the clean room 11 where the coating and developing apparatus is provided by a wall.

This patent application is based on Japanese Priority Patent Application No. 2006-244653 filed on Sep. 8, 2006, the entire contents of which are hereby incorporated by reference.

What is claimed is:

1. A liquid processing method using a liquid processing apparatus, the liquid processing apparatus including an apparatus main body, the apparatus main body having:
    a liquid processing unit provided in a clean room and configured to supply a chemical solution to a substrate and perform a liquid process;
    a heating unit configured to perform a heating process on the substrate before or after the liquid process is performed by the liquid processing unit; and
    a transferring part configured to transfer the substrate between the heating unit and the liquid processing unit;
    the liquid processing method comprising:
    a step of suctioning air in the clean room and taking the air into a power room having an atmosphere separated from the clean room by a partition member;
    a step of controlling a temperature of the air taken in via the air suction path in the power room;
    a step of supplying the air whose temperature is controlled to the liquid processing unit;
    a step of suctioning the air from the air suction path and supplying the air via the air supplying path; and
    a step of cleaning the air taken in from the air suction path;
    wherein the air suction path and the air supplying path are formed by either an internal space of an internal pipe of a double pipe or a space between the internal pipe and an external pipe of the double pipe.

2. The liquid processing method as claimed in claim 1 further comprising:
    a step of controlling moisture in the air taken in via the air suction path in the power room.

3. The liquid processing method as claimed in claim 1, wherein the power room is formed under a floor of a room where the apparatus main body is provided.

4. The liquid processing method as claimed in claim 1,
wherein the number of the liquid processing units is plural;
one liquid processing unit is a resist coating unit configured to coat resist liquid onto the substrate; and
another liquid processing unit is a developing unit configured to supply developing liquid to the substrate and develop the resist.

5. The liquid processing method as claimed in claim 1,
wherein an opening for jetting the air is provided at a ceiling of the clean room; and
a step of suctioning the air in the clean room from the air suction path and taking the air in the power room is performed in a position having the same height as the apparatus main body or a position higher than the apparatus main body.

6. The liquid processing method as claimed in claim 1 further comprising:
a step of suctioning the air supplied to the liquid processing unit to the air suction path.

7. The liquid processing method as claimed in claim 1,
wherein the apparatus main body includes an electric unit having an electric apparatus; and
the liquid processing method further includes a step of suctioning an atmosphere of the electric unit to the air suction path.

8. The liquid processing method as claimed in claim 1,
wherein the apparatus main body includes a chemical unit where the chemical solution is stored; and
the liquid processing method further includes a step of suctioning an atmosphere of the chemical unit to the air suction path.

9. The liquid processing method as claimed in claim 8, further comprising:
a step of removing a chemical solution composition contained in the air suctioned into the air suction path from the chemical unit.

10. A recording medium where a computer program is stored, the computer program used for a liquid processing apparatus, the liquid being processing apparatus including an apparatus main body, the apparatus main body having:
a liquid processing unit provided in a clean room and configured to supply a chemical solution to a substrate and perform a liquid process;
a heating unit configured to perform a heating process on the substrate before or after the liquid process is performed by the liquid processing unit; and
a transferring part configured to transfer the substrate between the heating unit and the liquid processing unit;
the computer program implementing a liquid processing method, the liquid processing method comprising:
a step of suctioning air in the clean room and taking the air in a power room having an atmosphere separated from the clean room by a partition member;
a step of controlling a temperature of the air taken in via the air suction path in the power room;
a step of supplying the air whose temperature is controlled to the liquid processing unit;
a step of suctioning the air from the air suction path and supplying the air via the air supplying path; and
a step of cleaning the air taken in from the air suction path;
wherein the air suction path and the air supplying path are formed by either an internal space of an internal pipe of a double pipe or a space between the internal pipe and an external pipe of the double pipe.

* * * * *